(12) United States Patent
Dick et al.

(10) Patent No.: US 11,612,061 B2
(45) Date of Patent: Mar. 21, 2023

(54) LASER DIRECT STRUCTURING OF SWITCHES

(71) Applicant: Appareo IoT, LLC, Fargo, ND (US)

(72) Inventors: Wyatt Dick, Fargo, ND (US); Jeff Johnson, West Fargo, ND (US); Christopher Horne, Fargo, ND (US)

(73) Assignee: Appareo IoT, LLC, Fargo, ND (US)

( * ) Notice: Subject to any disclaimer, the term of this patent is extended or adjusted under 35 U.S.C. 154(b) by 0 days.

(21) Appl. No.: 17/038,536

(22) Filed: Sep. 30, 2020

(65) Prior Publication Data

US 2021/0144860 A1 May 13, 2021

Related U.S. Application Data

(60) Provisional application No. 62/908,563, filed on Sep. 30, 2019.

(51) Int. Cl.
*H05K 3/18* (2006.01)
*H01Q 1/46* (2006.01)

(52) U.S. Cl.
CPC .............. *H05K 3/185* (2013.01); *H01Q 1/46* (2013.01); *H05K 2203/107* (2013.01)

(58) Field of Classification Search
CPC ............ H01Q 1/273; H01Q 1/44; H01Q 1/46; H01H 1/20; A61B 5/1117; G08B 21/0446; H05K 3/182; H05K 3/185; H05K 2203/107
See application file for complete search history.

(56) References Cited

U.S. PATENT DOCUMENTS

| | | | | |
|---|---|---|---|---|
| 9,542,816 | B1* | 1/2017 | Mor | H04R 17/00 |
| 2011/0255260 | A1* | 10/2011 | Weber | H05K 7/14 |
| | | | | 200/341 |
| 2014/0076704 | A1* | 3/2014 | Los | H01H 13/807 |
| | | | | 200/513 |
| 2015/0214625 | A1* | 7/2015 | Sawa | H01Q 9/0414 |
| | | | | 343/700 MS |
| 2015/0280312 | A1* | 10/2015 | Poggio | H01Q 1/243 |
| | | | | 343/702 |
| 2015/0364815 | A1* | 12/2015 | Yong | H01Q 1/243 |
| | | | | 343/702 |
| 2016/0358897 | A1* | 12/2016 | Albers | H01L 28/00 |
| 2018/0261914 | A1* | 9/2018 | Kerselaers | H01Q 1/44 |
| 2020/0337162 | A1* | 10/2020 | Perkins | H04W 12/47 |

FOREIGN PATENT DOCUMENTS

| | | | |
|---|---|---|---|
| CN | 102665378 A | * 9/2012 | |
| FR | 3111063 A1 | * 12/2021 | |
| GB | 2495294 A | * 4/2013 | ......... G08B 21/0272 |

* cited by examiner

*Primary Examiner* — Dameon E Levi
*Assistant Examiner* — Leah Rosenberg
(74) *Attorney, Agent, or Firm* — Danielson Legal LLC

(57) ABSTRACT

Methods and systems for creating a device having a switch trace are disclosed. The systems and methods described herein may include a device that has a chassis, the chassis having a top and a bottom, at least one antenna affixed to the top of the chassis, a first laser direct structuring-fabricated (LDS) trace, a second LDS trace, and a button, the button connected to the first LDS trace and the top of the chassis, wherein the button is configured to contact the second LDS trace when the button is depressed and complete a circuit between the first LDS trace and the second LDS trace upon contact.

18 Claims, 4 Drawing Sheets

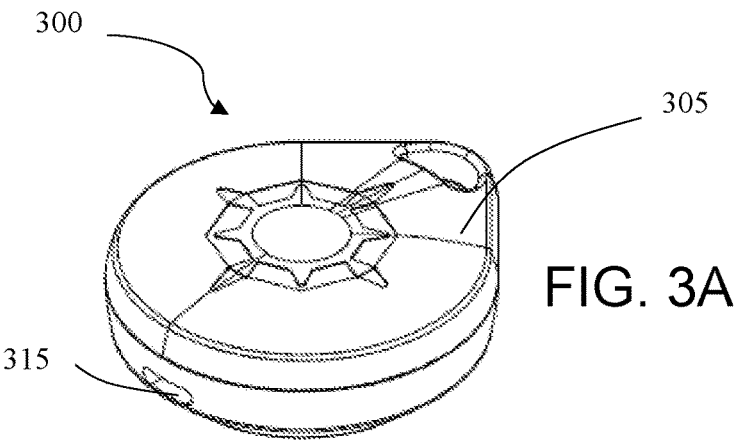
FIG. 3A
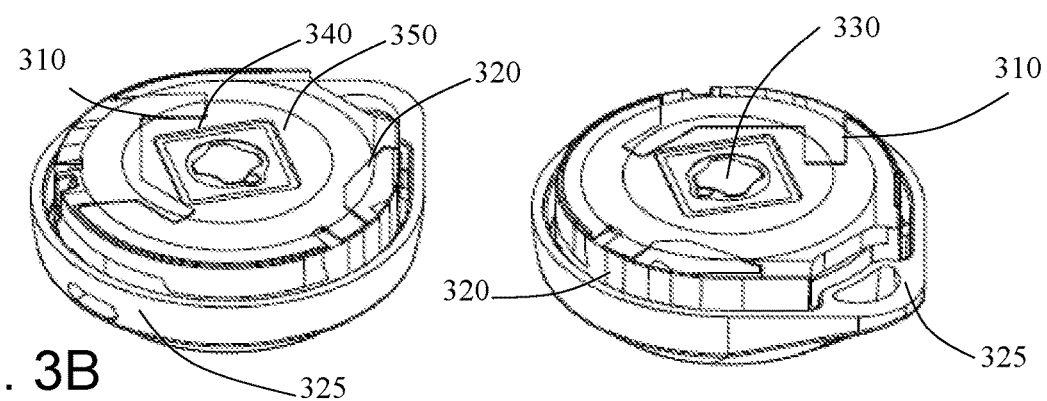
FIG. 3B
FIG. 3C
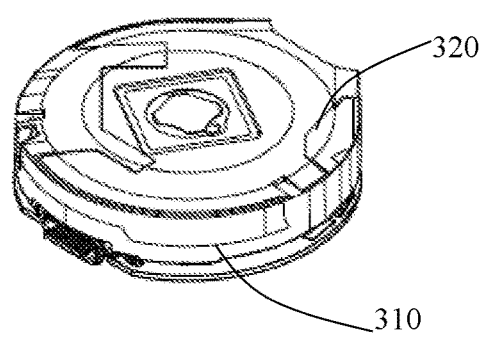
FIG. 3D

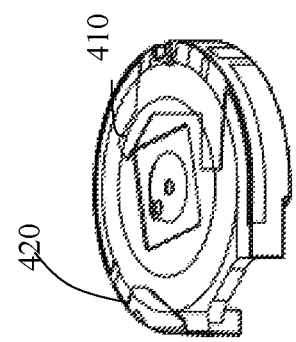
FIG. 4F
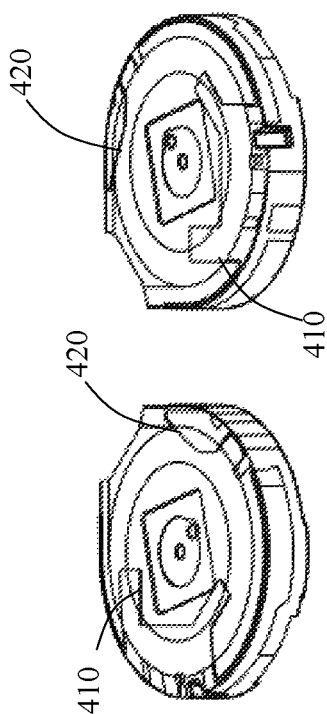
FIG. 4E
FIG. 4D
FIG. 4A
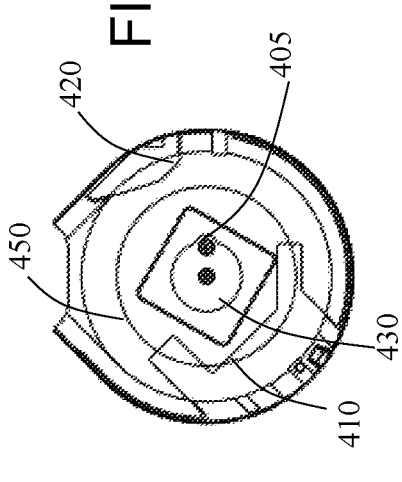
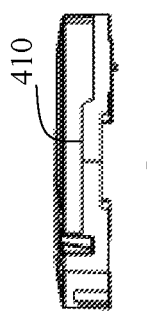
FIG. 4B
FIG. 4C
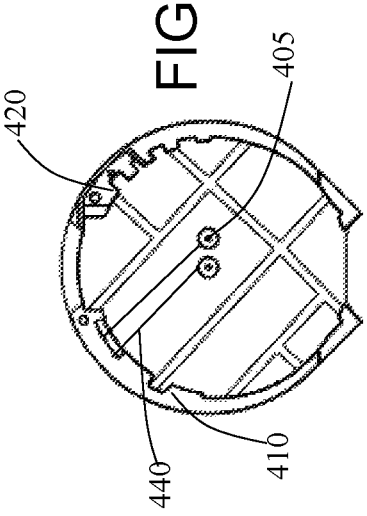

LASER DIRECT STRUCTURING OF SWITCHES

CROSS-REFERENCE TO RELATED APPLICATIONS

The present application claims the benefit of U.S. provisional application No. 62/908,563, filed on Sep. 30, 2019, the entire disclosure of which is incorporated by reference as if set forth in its entirety herein.

TECHNICAL FIELD

Embodiments described herein generally relate to the laser direct structuring of switches, and more specifically to methods and systems for manufacturing a device having at least one antenna on a chassis and a button connected to a laser direct structuring trace on the same chassis.

BACKGROUND

Laser direct structuring (LDS) is a process whereby circuit traces, such as antennae, can be fabricated on a plastic carrier. This carrier can be an existing part of a product's housing or a separate plastic piece.

The plastic carrier is an injection molded component, produced using a specific polymer material. These select polymer blends allow adhesion of metallic traces following activation of the carrier surface by laser. This laser activates the substrate surface generating the circuit trace shape required. The trace shape is then selectively metalized using various chemical solutions to produce the conductive traces that form the shape of the circuit. LDS is an alternative to metal stamped or flexible adhesive circuit designs where the shape of the circuit is too complex or when the space allowed for placement is limited.

Antenna design for a device is an important consideration and is often limited by strict performance constraints. For certain devices, an internal antenna may be located very close to a battery. In some cases, the antenna must be placed carefully to prevent mutual coupling. Such coupling could introduce an additional inductor and/or capacitor resulting in reduced antenna performance.

There are several limitations to data receiving and transmitting devices. Some are only configured to send and receive data over particular frequency bands. Some antennae must be attached to chassis and separate from an activation unit, such as a button or switch. This creates expensive, bulky devices with more items prone to breaking. A need therefore exists for improved devices.

SUMMARY

This summary is provided to introduce a selection of concepts in a simplified form that are further described below in the Detailed Description. This summary is not meant or intended to identify or exclude key features or essential features of the claimed subject matter, nor is it intended to be used as an aid in determining the scope of the claimed subject matter.

According to one aspect, embodiments relate to a device comprising: a chassis having a top and a bottom; at least one antenna affixed to the top of the chassis; a first laser direct structuring-fabricated (LDS) trace; a second LDS trace; and a button connected to the first LDS trace and the top of the chassis, wherein the button is configured to contact the second LDS trace when the button is depressed; and complete a circuit between the first LDS trace and the second LDS trace upon contact.

In some embodiments, the chassis is an antenna chassis.

In some embodiments, the first LDS trace and the second LDS trace extend through the chassis.

In some embodiments, the button is a dome switch.

In some embodiments, the antenna is configured to receive at least one of GPS, cellular, and Bluetooth data.

In some embodiments, the antenna is not configured to receive radio waves.

In some embodiments, the chassis comprises a thermoplastic substrate.

Some embodiments may further comprise a plurality of antennae attached to the chassis. In some embodiments, the plurality of antennae are sintered to the chassis.

Some embodiments may further comprise a battery and a printed circuit board, wherein the battery is coupled to the bottom of the chassis and the printed circuit board is coupled to the battery.

In some embodiments, the at least one LDS trace comprises at least one of copper, nickel, gold, or any combination thereof.

In another aspect, embodiments relate to a method of manufacturing a device, the method comprising: affixing at least one antenna to a top of the chassis, the chassis having a bottom opposite the top; affixing a first LDS trace to the chassis; affixing a second LDS trace to the chassis; and connecting a button to the first LDS trace and the top of the chassis, wherein the button is configured to contact the second LDS trace when the button is depressed; and complete a circuit between the first LDS trace and the second LDS trace upon contact.

In some embodiments, the chassis is an antenna chassis.

In some embodiments, the first LDS trace and the second LDS trace extend through the chassis.

In some embodiments, at least one LDS trace is formed by depositing copper onto the chassis; depositing nickel onto the copper; and depositing gold onto the nickel.

In some embodiments, the button is a dome switch.

Some embodiments further comprise receiving at least one of GPS, BLUETOOTH® data, or cellular data with the antenna.

Some embodiments further comprise affixing a plurality of antennae to the chassis. In some embodiments, the plurality of antennae are sintered to the chassis.

In some embodiments, a first portion of the first LDS trace, a second portion of the second LDS trace, and the at least one antenna are located on the same face of the chassis.

BRIEF DESCRIPTION OF DRAWINGS

FIG. 3A shows the enclosure of a low-profile tactile switch, in accordance with some embodiments;

FIG. 3B shows a chassis, antennae, a switch, and a lower device enclosure casing, in accordance with some embodiments;

FIG. 3C shows a chassis, antennae, a switch, and a lower device enclosure casing, in accordance with some embodiments;

FIG. 3D shows a chassis, antennae, and a switch, in accordance with some embodiments;

FIG. 4A shows a top view of antennae and LDS traces on a chassis, in accordance with some embodiments;

FIG. 4B shows a side view of antennae and LDS traces on a chassis, in accordance with some embodiments;

FIG. 4C shows a bottom view of antennae and LDS traces on a chassis, in accordance with some embodiments;

FIG. 4D shows a projected front view of antennae and LDS traces on a chassis, in accordance with some embodiments;

FIG. 4E shows a projected back view of antennae and LDS traces on a chassis, in accordance with some embodiments; and FIG. 4F shows a projected back view of antennae and LDS traces on a chassis, in accordance with some embodiments.

DETAILED DESCRIPTION

Various embodiments are described more fully below with reference to the accompanying drawings, which form a part hereof, and which show specific exemplary embodiments. However, the concepts of the present disclosure may be implemented in many different forms and should not be construed as limited to the embodiments set forth herein; rather, these embodiments are provided as part of a thorough and complete disclosure, to fully convey the scope of the concepts, techniques and implementations of the present disclosure to those skilled in the art. Embodiments may be practiced as methods, systems or devices. Accordingly, embodiments may take the form of a hardware implementation, an entirely software implementation or an implementation combining software and hardware aspects. The following detailed description is, therefore, not to be taken in a limiting sense.

Reference in the specification to "one embodiment" or to "an embodiment" means that a particular feature, structure, or characteristic described in connection with the embodiments is included in at least one example implementation or technique in accordance with the present disclosure. The appearances of the phrase "in one embodiment" in various places in the specification are not necessarily all referring to the same embodiment.

In addition, the language used in the specification has been principally selected for readability and instructional purposes and may not have been selected to delineate or circumscribe the disclosed subject matter. Accordingly, the present disclosure is intended to be illustrative, and not limiting, of the scope of the concepts discussed herein.

Figure 1:
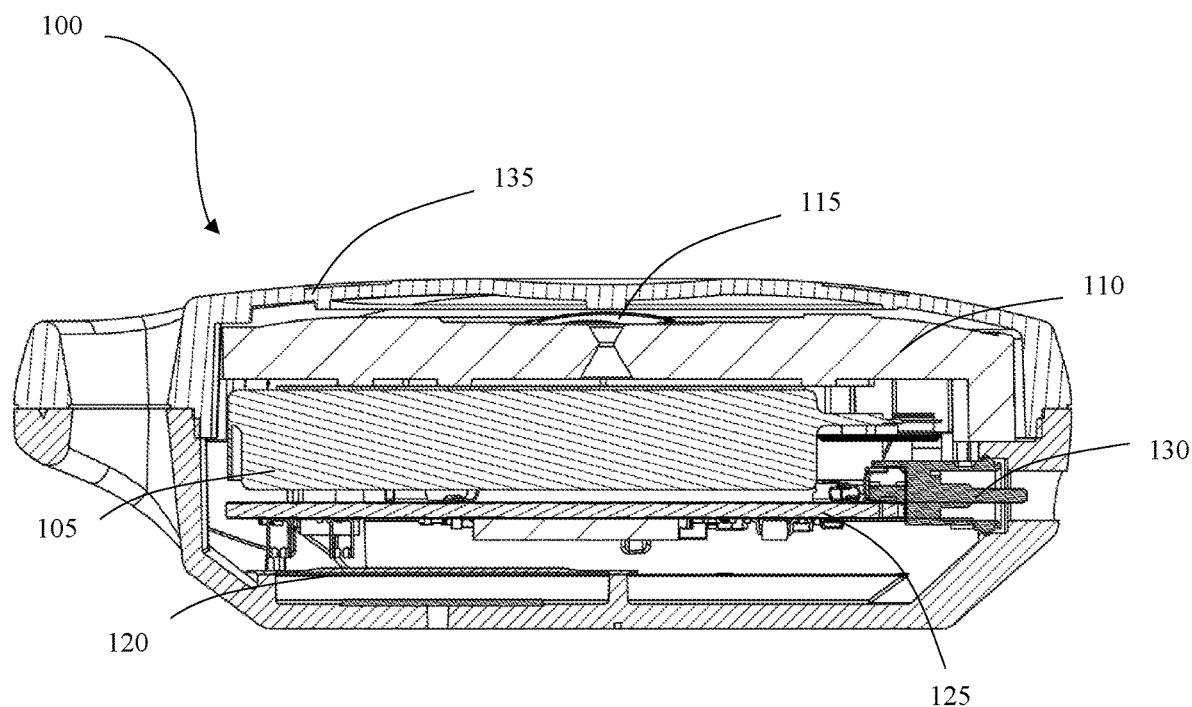
FIG. 1 shows a low-profile tactile switch including a chassis and a metal dome switch, in accordance with some embodiments.

Embodiments of the present invention relate to the creation of a device having LDS switch traces. FIG. 1 shows a device comprising a low-profile tactile switch 100 including a chassis 110 and a metal dome switch 115, in accordance with one embodiment. In some embodiments, the switch is surrounded by an enclosure 135. In some embodiments, the chassis 110 includes one LDS trace (shown in FIG. 2) in the chassis 110 configured to connect to the metal dome switch 115 and a second LDS trace in the chassis 110 permanently connected to the metal dome switch 115. In some embodiments, when a user depresses the enclosure 135 and thereby the metal dome switch 115, the metal dome switch 115 may connect both LDS traces in the chassis 110. As a result of the contact, metal dome switch may complete a circuit within the switch 100. When the circuit is completed, the LDS traces may send a signal to the printed circuit board 125 to process. Some embodiments may use a piezoelectric diaphragm 120 to assist in detecting at least one of the number of depressions, duration of a depression, and pressure of a depression from the user to the enclosure 135. The printed circuit board 125 may process different signals, depending on at least one of the number of depressions, duration of a depression, and pressure of a depression from the user to the enclosure 135 in some embodiments. In some embodiments, the enclosure 135 is configured to flex enough to allow an easy press of the button by the user, but not so much as to suffer fatigue failure or cracking of the enclosure if pressed often or too hard.

In some embodiments, the low-profile tactile switch 100 may operate with a battery 105. In some embodiments, at least one LDS trace may be in contact with the battery 105. In some embodiments, two or more LDS traces may be in contact with the battery 105. In some embodiments, the printed circuit board 125 may have a USB-C connector 130 and a user may be able to send information to or download information from the printed circuit board 125 through the USB-C connector 130.

In some embodiments, the enclosure 135 is made of an insulating material, such as a plastic. In some embodiments, the chassis 110 is made of an insulating material, such as a plastic or thermoplastic substrate. In some embodiments, the chassis 110 is configured to resist flexing when a button, such as a metal dome switch 115, is depressed.

Figure 2:
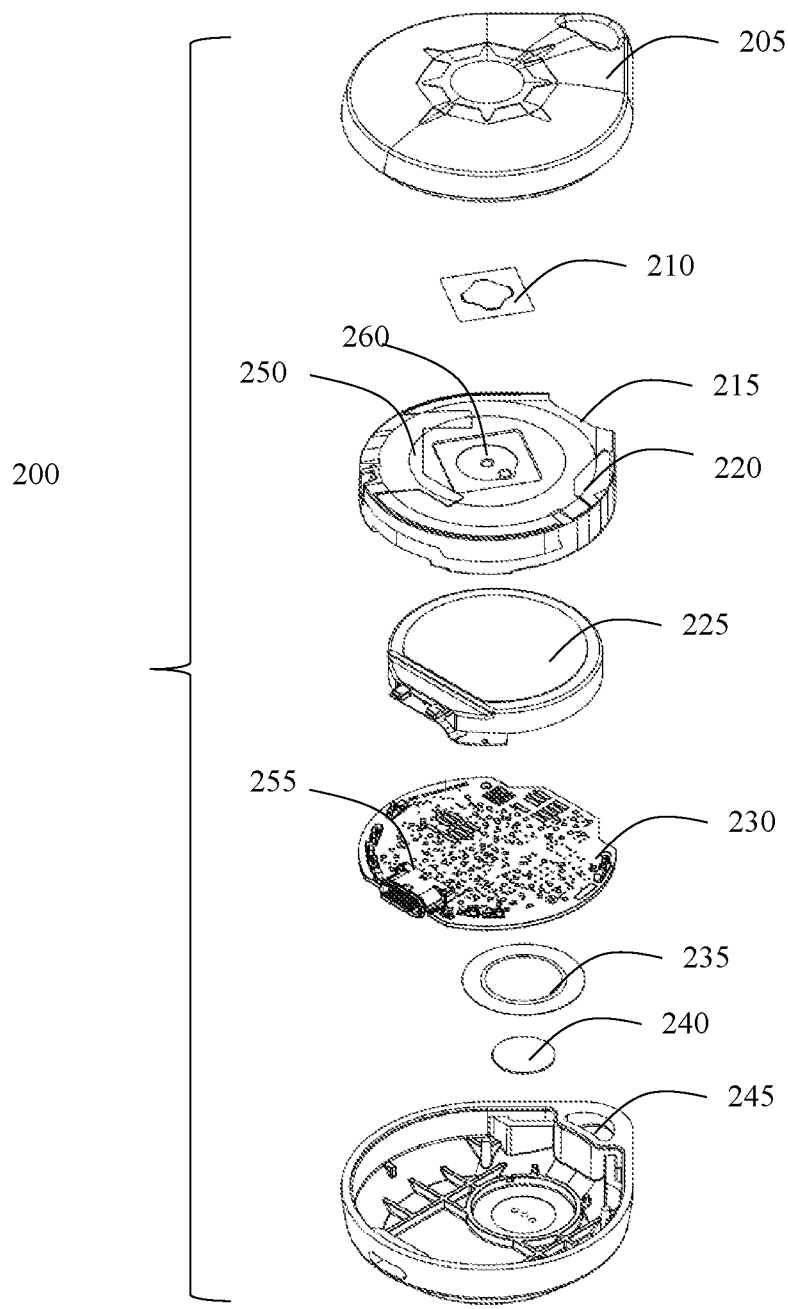
FIG. 2 shows an exploded view of a low-profile tactile switch, including the chassis with two antenna traces, in accordance with some embodiments.

FIG. 2 shows an exploded view of a low-profile tactile switch 200, including the chassis 215 with two antenna traces 220, 250, in accordance with one embodiment. In some embodiments, the switch 200 has an enclosure comprising a top 205 and a bottom 245. Together, the top 205 and bottom 245 enclose the entirety of the other features of the device.

In some embodiments, these features comprise a metal dome switch 210, a chassis 215 with antenna traces 220, 250 and LDS traces 260, a battery 225, a printed circuit board 230 with a USB-C connector, a piezoelectric diaphragm 235, and a vent 240.

In some embodiments, the metal dome switch 210 is attached to the chassis 215 over the LDS traces 260. In some embodiments, the metal dome switch 210 may be attached to the chassis 215 with a sticker. In some embodiments, the metal dome switch may be sintered to the chassis 215. In some embodiments, the metal dome switch 210 is attached to at least one LDS trace 260 and is configured to contact another LDS trace 260 if a user presses the top 205 of the enclosure. During contact with both LDS traces 260, the metal dome switch 210 is configured to complete a circuit within the low-profile tactile switch 200, the circuit comprising the two LDS traces 260 within the chassis 215, the battery 225, the printed circuit board 230, and the metal dome switch 210. In some embodiments, the circuit may also include the piezoelectric diaphragm 235.

In some embodiments, the piezoelectric diaphragm 235 rests on a vent 240, which is a space configured to communicate with the bottom 245 of the enclosure, such that the piezoelectric diaphragm 235 is configured to register at least one of the number of depressions, the pressure of a depression, and the duration of a depression from a user to the switch 200.

In some embodiments, a different number of depressions, duration of depression, or pressure of a depression may signal a different task for the switch 200. For example, if the top 205 or a button on the top 205 of the switch 200 is depressed for over 15 seconds, the switch 200 may reset. In some embodiments, a user may depress the top 205 for between five to ten seconds to reset the device.

In some embodiments, a plurality of depressions from the user within a certain amount of time may signal a task for the switch 200. For example, one short depression of the top 205 may activate or deactivate the switch 200. In some embodiments, the switch 200 may be active at all times. In some embodiments, a plurality or pattern of depressions may signal the device to retrieve at least one of UPS, BLUETOOTH® data, or cellular data through an antenna 220, 250. In some embodiments, a different plurality or pattern of depressions may signal the device to send at least one of BLUETOOTH® data or cellular data through an antenna 220, 250.

In some embodiments, the chassis 215 only has one antenna trace 220. In some embodiments, the chassis 215 may have two or more antenna traces 220, 250. In some embodiments, one antenna 220 is configured to send and receive BLUETOOTH® data. In some embodiments, one antenna 250 is configured to receive UPS data and to send and receive cellular data. In some embodiments, an antenna 250 is configured to receive GPS data, convert the data to BLUETOOTH® data or cellular data with the printed circuit board 230, and export the converted data with an antenna 220, 250 or through the USB-C connector 255. In some embodiments, the USB-C connector 255 may be used for charging the switch 200.

In some embodiments, the metal dome switch 210 is attached to the same chassis 215 as the antennas 220, 250. Although FIG. 2 shows a metal dome switch 210, embodiments may use any button, switch, or other tactile device to complete the circuit within the switch 200. In some embodiments, the LDS traces 260 may extend through the chassis 215 and contact the battery 225. In some embodiments, the antennas 220, 250 are configured to not touch the battery 225.

Some embodiments comprise manufacturing the low-profile tactile switch 200. In some embodiments, at least one antenna 220 may be affixed to the top of the chassis 215 and at least two LDS traces 260 may be affixed to the chassis 215. In some embodiments, the at least one antenna 220 may be sintered to the chassis 215. In some embodiments, a button may be connected to one LDS trace 260 at the top of the chassis 215. In some embodiments, the button may be a metal dome switch 210. In some embodiments, the button may contact the second LDS trace 260 when depressed and complete a circuit between the LDS traces.

FIG. 3A shows the enclosure of a low-profile tactile switch 300 in accordance with one embodiment. The enclosure may comprise a casing 305 and a charging or USB port 315. In some embodiments, the enclosure has a thickness between 0.60 mm and 1.00 mm. In some embodiments, the enclosure has a thickness between 0.70 mm and 0.90 mm. In some embodiments, the enclosure has a thickness of 0.80 mm.

FIGS. 3B and 3C show different perspectives of a chassis 350, antennae 310, 320, a switch 330, and a lower device enclosure casing 325, in accordance with one embodiment. FIG. 3D shows a chassis 350, antennae 310, 320, and a switch 330, in accordance with one embodiment.

In some embodiments, the switch 330 may be a dome or button within an indent 340 of the chassis 350. In some embodiments, LDS traces may also be attached or within the indent 340.

In some embodiments, the LDS process may deposit traces for the switch 330 on a chassis 350 made of plastic. In some embodiments, the switch traces may be deposited via an LDS process in proximity to an internal structure like a GPS, BLUETOOTH® data, or cellular antenna 310, 320.

In some embodiments, the antennas 310, 320 may include at least one of a BLUETOOTH® low energy antenna, a cellular LIE category M1 antenna, a GNSS antenna, or any combination thereof.

FIG. 4A shows a top view of antennae 410, 420 and LDS traces 405 on a chassis 450, in accordance with one embodiment. FIGS. 4B, 4C, 4D, 4E, and 4F show alternative views of the antennae 410, 420 and LDS traces 405 on a chassis 450, in accordance with one embodiment.

In some embodiments, one antenna 410 is configured to transmit cellular data and receive GPS and cellular data. In some embodiments, one antenna 420 is configured to receive and transmit BLUETOOTH® data. In some embodiments, the antennas 410, 420 extend along the top and sides of the chassis 450.

In some embodiments, the chassis 450 may have an indent 430 where the LDS traces 405 are configured to contact a button or switch. The LDS traces 405 may be composed of a thin layer of copper formed on a doped thermoplastic substrate, such as a chassis 450, after exposure to a laser, in accordance with some embodiments. In some embodiments, the thin layer of copper may be followed by a thicker layer of nickel, formed by exposing the etched traces to a bath. In some embodiments, a thin layer of gold may then be placed over the nickel using, for example, chemical vapor deposition. In some embodiments, the LDS traces 405 may comprise a combination of gold and nickel, due to the malleability of gold and the toughness of nickel. In some embodiments, the LDS traces 405 may comprise at least one of copper, nickel, gold, or any combination thereof. In some embodiments, the gold may wear away after a small number actuation cycles because the gold is soft.

In some embodiments, the copper may be added in a separate electroless plating process following laser etching. The same process is then repeated for each other layer, such as gold or nickel, in some embodiments.

In some embodiments, the LDS traces 405 may extend through the chassis 450, such that an end of each LDS trace may be on the top of the chassis 450 and a second, connected end may be at the bottom of the chassis 450. In some embodiments, the LDS traces 405 may be connected 440 to the antenna 410.

In some embodiments, the switch may be used as an emergency button. For example, in some embodiments, a user may press the button on the switch and the switch may connect to a network. In some embodiments, the network may send a signal regarding the location of the user. The signal may be sent to a phone, computer, or other device configured to receive at least one of BLUETOOTH® data or cellular data.

In some embodiments, the information may be sent by the switch without a button depression. For example, the switch may be used as a tracking device and be paired with an application on a phone, computer, or other device configured to send or receive at least one of BLUETOOTH® data, GPS, or cellular data. A user may remotely request at least one of Bluetooth or cellular data from the switch and the switch may send data to the user. In some embodiments, the switch may be used as a means to contact an owner about a lost pet or object, a way for an owner to receive location information about the lost pet or object, or both. In some embodiments, a switch may also be used as an accelerometer and may be used to track motion.

Embodiments of the present disclosure, for example, are described above with reference to block diagrams and/or operational illustrations of methods, systems, and computer program products according to embodiments of the present disclosure. The functions/acts noted in the blocks may occur out of the order as shown in any flowchart. For example, two blocks shown in succession may in fact be executed substantially concurrent or the blocks may sometimes be executed in the reverse order, depending upon the functionality/acts involved. Additionally, or alternatively, not all of the blocks shown in any flowchart need to be performed and/or executed. For example, if a given flowchart has five blocks containing functions/acts, it may be the case that only three of the five blocks are performed and/or executed. In this example, any of the three of the five blocks may be performed and/or executed.

A statement that a value exceeds (or is more than) a first threshold value is equivalent to a statement that the value meets or exceeds a second threshold value that is slightly greater than the first threshold value, e.g., the second threshold value being one value higher than the first threshold value in the resolution of a relevant system. A statement that a value is less than (or is within) a first threshold value is equivalent to a statement that the value is less than or equal to a second threshold value that is slightly lower than the first threshold value, e.g., the second threshold value being one value lower than the first threshold value in the resolution of the relevant system.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Having described several example configurations, various modifications, alternative constructions, and equivalents may be used without departing from the spirit of the disclosure. For example, the above elements may be components of a larger system, wherein other rules may take precedence over or otherwise modify the application of various implementations or techniques of the present disclosure. Also, a number of steps may be undertaken before, during, or after the above elements are considered.

Having been provided with the description and illustration of the present application, one skilled in the art may envision variations, modifications, and alternate embodiments falling within the general inventive concept discussed in this application that do not depart from the scope of the following claims.

What is claimed is:

1. A device comprising:
   a chassis having a top and a bottom, wherein the top of the chassis includes a center indent portion;
   at least one antenna affixed to the top of the chassis;
   a first laser direct structuring-fabricated (LDS) trace that is positioned in the center indent portion;
   a second LDS trace that is positioned in the center indent portion and electrically isolated from the first LDS trace; and
   a button operably positioned with respect to the center indent portion and connected to:
      the first LDS trace; and
      the top of the chassis, wherein the button is configured to:
         contact the second LDS trace when the button is depressed; and
         complete an electrical circuit between the first LDS trace and the second LDS trace upon contact, wherein the first LDS trace and the second LDS trace extend from the top of the chassis to the bottom of the chassis and each include a connection extending from the center indent portion to connect to the at least one antenna.

2. The device of claim 1 wherein the chassis is an antenna chassis.

3. The device of claim 1, wherein the button is a dome switch.

4. The device of claim 1, wherein the at least one antenna is configured to receive at least one of GPS, cellular, and BLUETOOTH® data.

5. The device of claim 1, wherein the chassis comprises a thermoplastic substrate.

6. The device of claim 1, further comprising a plurality of antennae attached to the chassis.

7. The device of claim 6, wherein the plurality of antennae are sintered to the chassis.

8. The device of claim 1, further comprising a battery and a printed circuit board, wherein the battery is coupled to the bottom of the chassis and the printed circuit board is coupled to the battery.

9. The device of claim 1, wherein at least one LDS trace comprises at least one of copper, nickel, gold, or any combination thereof.

10. A method of manufacturing a device, the method comprising:
    affixing at least one antenna to a top of a chassis, the chassis having a bottom opposite the top and a center indent portion;
    affixing a first LDS trace in the center indent portion of the chassis;
    affixing a second LDS trace in the center indent portion of the chassis, wherein the second LDS trace is electrically isolated from the first LDS trace; and
    connecting a button to the first LDS trace and the top of the chassis, wherein the button is operably positioned with respect to the center indent portion and is configured to:
       contact the second LDS trace when the button is depressed; and
       complete a circuit between the first LDS trace and the second LDS trace upon contact, wherein the first LDS trace and the second LDS trace extend from the top of the chassis to the bottom of the chassis and each include a connection extending from the center indent portion to connect to the at least one antenna.

11. The method of claim 10, wherein the chassis is an antenna chassis.

12. The method of claim 10, wherein the chassis comprises a thermoplastic substrate.

13. The method of claim 10, wherein the first LDS trace is formed by:
    depositing copper onto the chassis;
    depositing nickel onto the copper; and
    depositing gold onto the nickel.

14. The method of claim 10, wherein the button is a dome switch.

15. The method of claim 10, further comprising receiving at least one of GPS, BLUETOOTH®, or cellular data with the antenna.

16. The method of claim 10, further comprising affixing a plurality of antennae to the chassis.

17. The method of claim 16, wherein the plurality of antennae are sintered to the chassis.

18. The method of claim 10, wherein a first portion of the first LDS trace, a second portion of the second LDS trace, and the at least one antenna are located on the same face of the chassis.

* * * * *